(12) United States Patent
Yoneya et al.

(10) Patent No.: US 6,444,589 B1
(45) Date of Patent: Sep. 3, 2002

(54) METHOD AND APPARATUS FOR ETCHING SILICON

(75) Inventors: Akira Yoneya, Tokyo (JP); Noriyuki Kobayashi, Tokyo (JP); Nobuhiko Izuta, Tokyo (JP)

(73) Assignees: Nisso Engineering Co., Ltd., Tokyo (JP); Disco Corporation, Tokyo (JP)

(*) Notice: Subject to any disclaimer, the term of this patent is extended or adjusted under 35 U.S.C. 154(b) by 5 days.

(21) Appl. No.: 09/615,775

(22) Filed: Jul. 13, 2000

(30) Foreign Application Priority Data

Jul. 14, 1999 (JP) ............................................ 11-199869

(51) Int. Cl.[7] ............................................... H01L 21/00

(52) U.S. Cl. .................... 438/745; 156/345; 216/92; 216/93; 216/99; 438/748; 438/753

(58) Field of Search ................................ 438/745, 748, 438/753; 216/92, 93, 99; 156/345 L, 345 LS

(56) References Cited

U.S. PATENT DOCUMENTS

| 4,971,654 A | 11/1990 | Schnegg et al. |
| 5,266,152 A | 11/1993 | Iwasaki et al. |

FOREIGN PATENT DOCUMENTS

| EP | 60025668 | 12/1985 |
| EP | 0 317 210 A1 | 5/1989 |
| EP | 0 548 504 A2 | 6/1993 |

OTHER PUBLICATIONS

European Search Report for counterpart application No. EP 0011 4188 dated Oct. 20, 2000.

Primary Examiner—William A. Powell
(74) Attorney, Agent, or Firm—Smith, Gambrell & Russell, LLP

(57) ABSTRACT

An etching method and an etching apparatus for applying an etchant containing nitric acid and hydrofluoric acid to silicon to etch the silicon. The etchant used in etching is recovered, and brought into contact with a gas inert to the etchant, whereby the etchant is regenerated. At least a part of the regenerated etchant is reused in etching.

13 Claims, 2 Drawing Sheets

METHOD AND APPARATUS FOR ETCHING SILICON

FIELD OF THE INVENTION

This invention relates to a method and an apparatus for etching silicon by applying an etchant containing nitric acid and hydrofluoric acid to the silicon.

DESCRIPTION OF THE PRIOR ART

For the production of a semiconductor device, it is well known to form circuits in many areas arranged in a lattice pattern on the surface of a silicon wafer, and dice the silicon wafer to separate the individual areas, thereby producing semiconductor chips. Before dicing the silicon wafer, it is common practice to grind the entire area of the back side of the silicon wafer for the purpose of improving heat dissipation of the resulting semiconductor chips and/or making them thin slices, and then etch the entire area of the back side of the silicon wafer, thereby removing strains caused by grinding. Etching is performed by applying an etchant containing nitric acid and hydrofluoric acid to the back side of the silicon wafer.

When the back side of the silicon wafer is etched with a fresh etchant, the back side of the silicon wafer can be formed into the desired mirror surface. However, the repeated use of the etchant tends to turn the etchant brown and roughen the etched back side of the silicon wafer. To maintain a high etching quality, therefore, it is necessary to use a fresh etchant without repeatedly using the etchant. This makes etching treatment considerably costly.

SUMMARY OF THE INVENTION

The object of the present invention is to provide a novel and improved etching method and apparatus which can markedly reduce the cost of etching treatment by repeatedly using an etchant at least partially, without deteriorating the quality of etching, and which are particularly suitable for, but not restricted to, etching the back side of a silicon wafer.

The inventors of the present invention conducted extensive studies, and obtained the following findings: When silicon is etched with an etchant containing nitric acid and hydrofluoric acid, an $NO_x$ (x denotes a positive integer), such as $NO_2$ or NO, is formed. Owing to the presence of a considerable amount of such $NO_x$, the etchant is colored brown, and the etching quality of silicon declines. When the etchant, which has been used in etching and thus contains a considerable amount of $NO_x$, is brought into contact with a gas inert to the etchant, $NO_x$ is removed from the etchant while accompanying the gas. Hence, the etchant can be recycled without deterioration of the etching quality.

According to the present invention, as an etching method for attaining the above-described object, there is provided an etching method comprising an etching step of applying an etchant containing nitric acid and hydrofluoric acid to silicon to etch the silicon, including:

a recovery/regeneration step of recovering the etchant used in the etching step, and bringing a gas inert to the etchant into contact with the recovered etchant to regenerate the etchant, at least a part of the regenerated etchant after recovery and regeneration in the recovery/regeneration step being reused in the etching step.

The gas contacted with the etchant recovered in the recovery/regeneration step is preferably air. According to a preferred embodiment, in the etching step, a predetermined amount of the etchant is delivered out of the etchant accommodated in a circulation tank, and is applied to silicon, the regenerated etchant for reuse in the etching step is returned to the circulation tank, and a replenishing solution containing nitric acid and hydrofluoric acid is fed into the circulation tank for bringing at least the proportion of hydrofluoric acid in the etchant in the circulation tank to a predetermined value before the etchant is delivered from the circulation tank for a next etching step. Preferably, a predetermined proportion of the etchant regenerated in the recovery/regeneration step is discarded, and the remainder is reused in the etching step. The discarded proportion of the etchant regenerated in the recovery/regeneration step is preferably set such that an equilibrium is achieved between the amount of hexafluorosilicic acid formed in the etching step and the amount of hexafluorosilicic acid contained in the regenerated etchant discarded. The temperature of the etchant applied to the silicon in the etching step is preferably adjusted to a predetermined temperature.

According to the present invention, as an etching apparatus for attaining the above-described object, there is provided an etching apparatus for applying an etchant containing nitric acid and hydrofluoric acid to silicon to etch the silicon, comprising:

support means for supporting the silicon to be etched;

transport means for carrying the silicon to be etched onto the support means, and carrying the etched silicon out of the support means;

a circulation tank accommodating the etchant containing nitric acid and hydrofluoric acid;

etchant applicator means for applying the etchant accommodated in the circulation tank to the silicon supported by the support means;

recovery means for recovering the etchant applied to the silicon supported by the support means;

regeneration means for bringing a gas inert to the etchant into contact with the etchant recovered by the recovery means to regenerate the etchant; and circulation means for returning at least a part of the etchant regenerated by the regeneration means to the circulation tank.

The regeneration means preferably brings air into contact with the recovered etchant. The following are preferred embodiments: The regeneration means is composed of a gas-liquid contact tower including a main section packed with many packing elements, etchant introduction means for introducing the etchant to be regenerated, from above the main section into the main section, gas introduction means for introducing a gas from below the main section into the main section, and gas discharge means for discharging the gas from above the main section. The gas-liquid contact tower includes a collection tank for collecting the etchant that has flowed downward through the main section. The etchant introduction means introduces the etchant recovered by the recovery means into the main section, and also repeatedly introduces the etchant collected into the collection tank into the main section. Replenishment means is disposed for feeding a replenishing solution containing nitric acid and hydrofluoric acid into the circulation tank for bringing at least the proportion of hydrofluoric acid in the etchant in the circulation tank to a predetermined value before the etchant applicator means delivers the etchant from the circulation tank for a next etching step. Discard means is provided for discarding a predetermined proportion of the etchant regenerated by the regeneration means. The etchant applicator means delivers a predetermined amount of the etchant from the circulation tank, and applies it to the silicon supported by the support means. Preferably, temperature adjustment means is provided for adjusting the etchant in the circulation tank to a predetermined temperature.

DETAILED DESCRIPTION OF THE PREFERRED EMBODIMENTS

Preferred embodiments of an etching method and an etching apparatus in accordance with the present invention will now be described in detail with reference to the accompanying drawings.

Figure 1:
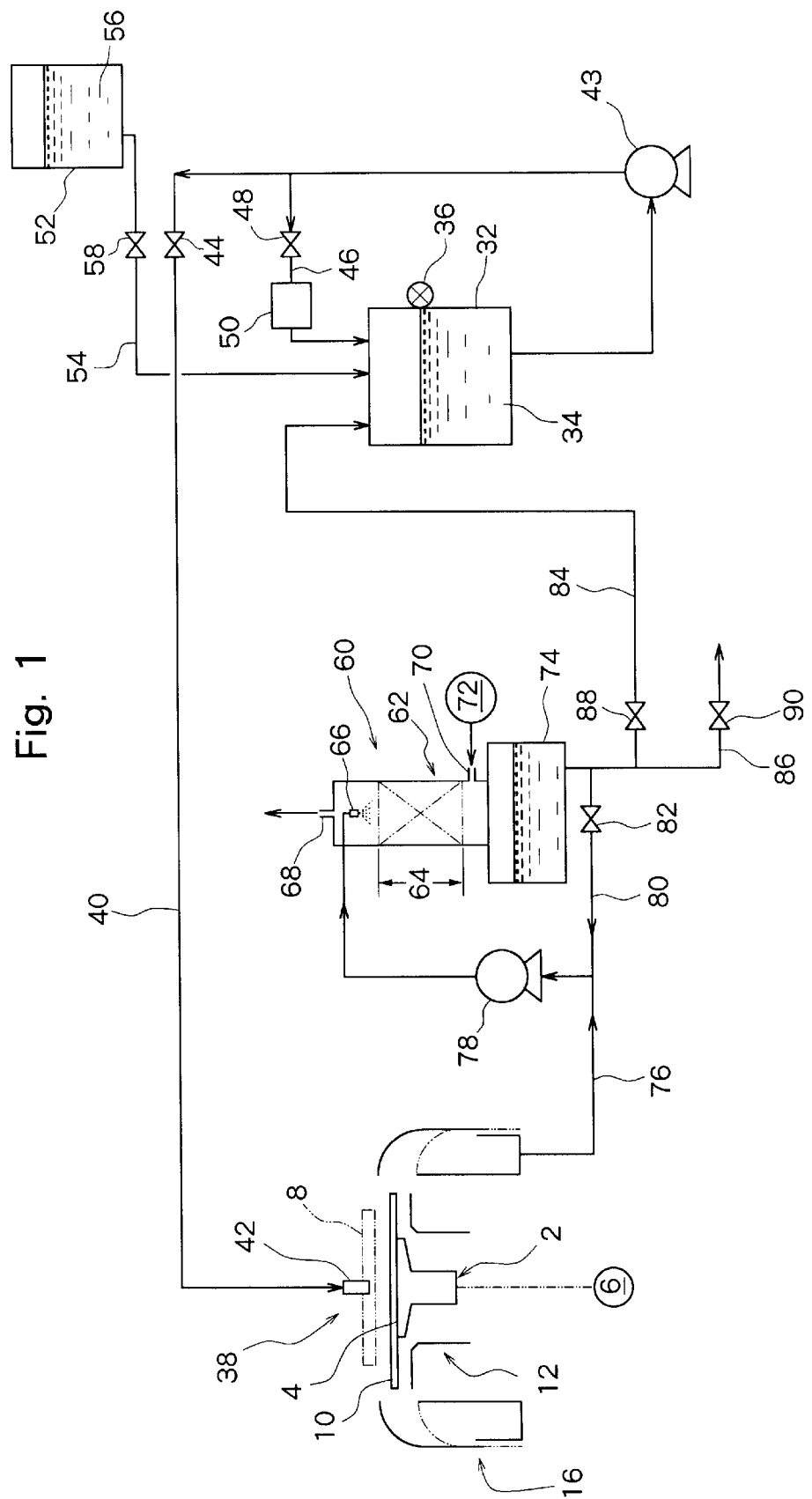
FIG. 1 is a schematic view showing a preferred embodiment of an etching apparatus constituted in accordance with the present invention.

FIG. 1 briefly shows an etching apparatus constituted in accordance with the present invention. The etching apparatus has support means 2 for supporting silicon to be etched. The support means 2 is rotatably mounted, and has at its upper end a substantially horizontal, flat, circular support surface 4. To the support means 2, a drive source 6 is connected via suitable driving connection means (not shown). When the drive source 6, optionally an electric motor, is energized, the support means 2 is rotated at a required rotational speed.

In conjunction with the support means 2, transport means 8 schematically shown in FIG. 1 is disposed. In the illustrated embodiment, the silicon to be etched is a nearly disk-like silicon wafer 10. The transport means 8 may be one in a well known form which can transport the silicon wafer 10 through a required path while vacuum attracting the silicon wafer 10 to a front end of a moving arm. Such transport means 8 carries one silicon wafer 10, which has been discharged, for example, from a grinding device, onto the support means 2, and carries the silicon wafer 10, which has been etched, rinsed and dried, from a site on the support means 2 to a required location (etching, rinsing and drying of the silicon wafer 10 will be described later on). The silicon wafer 10 carried onto the support means 2 is placed on the support means 2 upside down, i.e., with its back side directed upward. On the face side of the silicon wafer 10, accordingly, a lower surface of the silicon wafer 10 as placed on the support means 2, a circuit (not shown) is formed in each of many areas arranged in a lattice pattern. To the face side of the silicon wafer 10, a protective film (not shown) which can be formed from a suitable plastic film is bonded. The back side of the silicon wafer 10, accordingly, an upwardly exposed upper surface of the silicon wafer 10 as placed on the support means 2, has been ground with a grinding device called back grinder (not shown), before the silicon wafer 10 is carried onto the support means 2. Thus, the back side of the silicon wafer 10 has strains ascribed to grinding. Etching is performed in order to remove such strains. The outer diameter of the silicon wafer 10 borne on the support means 2 is somewhat greater than the outer diameter of the circular support surface 4 of the support means 2.

Figure 2:
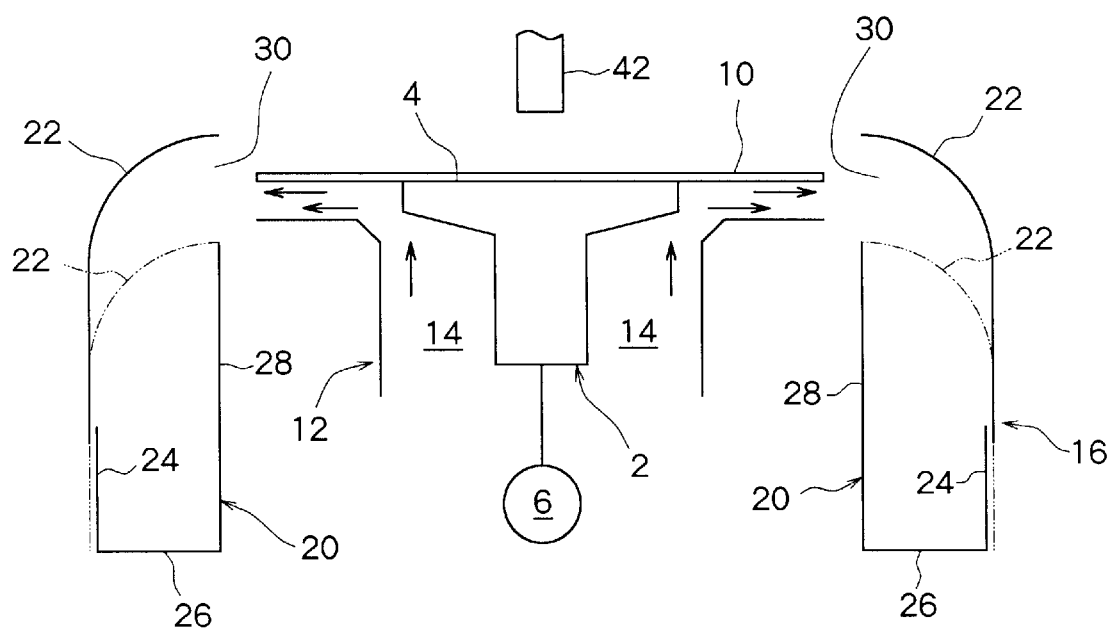
FIG. 2 is a schematic sectional view showing support means in the etching apparatus of FIG. 1, and means provided around the support means.

Referring to FIG. 2 along with FIG. 1, the support means 2 in the illustrated embodiment is equipped with air blow means 12. The air blow means 12 has a channel 14 extending from below the support means 2 up to a peripheral edge of the support means 2, and further extending along the lower surface of the silicon wafer 10 placed on the support means 2. Air supplied from a compressed air source (not shown) flows from around the peripheral edge of the support means 2 along the lower surface of the silicon wafer 10, and prevents an etchant, which has been applied to the upper surface of the silicon wafer 10, from flowing to the lower surface of the silicon wafer 10 (application of the etchant to the upper surface of the silicon wafer 10 will be described in further detail later on). The support means 2 is also equipped with recovery means 16 for recovering the etchant applied to the upper surface of the silicon wafer 10 on the support means 2. The recovery means 16 is composed of a stationary member 20 and a moving member 22 which cooperatively form a recovery tank. The stationary member 20 has a cylindrical outer wall 24, an annular bottom wall 26, and a cylindrical inner wall 28. The moving member 22 has a cylindrical lower portion, and an upper portion arcuate in sectional shape. During application of the etchant onto the upper surface of the silicon wafer 10 on the support means 2, the moving member 22 is located at an ascending position indicated by solid lines in FIG. 2. In this state, the etchant flowing radially on the upper surface of the silicon wafer 10 is admitted into the recovery means 16 from an annular inlet 30 defined between the upper end of the inner wall 28 of the stationary member 20 and the upper end of the moving member 22. When the silicon wafer 10 is rinsed with a cleaning liquid which may be pure water, the moving member 22 is located at a descending position indicated by two-dot chain lines in FIG. 2. Thus, the annular inlet 30 is closed, whereby the cleaning liquid is prevented from flowing into the recovery means 16.

With reference to FIG. 1, the etching apparatus includes a circulation tank 32. The circulation tank 32 accommodates an etchant 34 to be applied to the upper surface of the silicon wafer 10 borne on the support means 2. The etchant 34 is an aqueous solution containing nitric acid and hydrofluoric acid. The circulation tank 2 is provided with a level sensor 36 which detects the liquid level of the etchant accommodated in the circulation tank 32 when this liquid level reaches a predetermined position. Etchant applicator means 38 is disposed for applying the etchant 34 in the circulation tank 32 to the back side of the silicon wafer 10 on the support means 2. The etchant applicator means 38 in the illustrated embodiment includes a spray nozzle 42 connected to the circulation tank 32 via a channel 40. The spray nozzle 42 is selectively brought to an operating position (the position shown in FIG. 1) above the silicon wafer 10 borne on the support means 2, and a non-operating position retreated from above the silicon wafer 10. On the channel 40, a pump 43 and an on-off valve 44 are disposed.

Downstream from the pump 43, a branch path 46 is disposed for connecting the channel 40 to the circulation tank 32. On the branch path 46, temperature adjustment means 50 is disposed together with an on-off valve 48. The temperature adjustment means 50 may be composed of a heat exchanger which is itself well known. The circulation tank 32 is also provided with replenishment means 52 composed of a replenishing solution tank. The replenishment means 52 is connected to the circulation tank 32 via a channel 54. Inside the replenishment means 52, a replenishing solution 56 containing nitric acid and hydrofluoric acid is accommodated. On the channel 54, an on-off valve 58 is disposed for controlling feeding of a replenishing solution from the replenishing solution tank 52 to the circulation tank 32 for replenishment.

In the etching apparatus constituted in accordance with the present invention, it is important that regeneration means 60 be disposed. The regeneration means 60 in the illustrated embodiment is composed of a gas-liquid contact tower 62. The gas-liquid contact tower 62 may be shaped like an upright cylinder, and its main section 64 is packed with many packing elements (not shown) for promoting gas-liquid contact. At an upper end portion of the gas-liquid contact tower 62, there are disposed etchant introduction means 66 which can be composed of a spray nozzle, and gas discharge means 68 which may be an exhaust pipe. At a lower end portion of the gas-liquid contact tower 62, gas introduction means 70 which may be an inlet pipe is disposed. To the gas introduction means 70, a gas supply source 72 is connected. Below the gas-liquid contact tower 62, a collection tank 74 is disposed. The upper end of the collection tank 74 is in direct communication with the lower end of the gas-solution contact tower 62. If desired, instead of the regeneration means 60 composed of the gas-liquid contact tower 62 packed with many packing elements, there may be used other suitable form of regeneration means, for example, regeneration means composed of another type of gas-liquid contact tower such as a gas-liquid contact tower having many plates (so-called "plate tower"). Regeneration means may be composed of an open tank accommodating the etchant 34 to be regenerated, and gas introduction means for introducing a gas directly into this tank.

The aforementioned recovery means 16 is connected to the etchant introduction means 66 of the gas-liquid contact tower 62 via a channel 76. On the channel 76, a pump 78 is disposed. The collection tank 74 disposed below the gas-liquid contact tower 62 is connected to the channel 76, upstream from the pump 78, via a channel 80. on the channel 80, an on-off valve 82 is disposed. The collection tank 74 is further connected to the circulation tank 32 via a channel 84. The collection tank 74 is also provided with a drain path 86. On the channel 84 constituting circulation means, an on-off valve 88 is disposed. On the drain path 86 constituting discard means, an on-off valve 90 is disposed.

The actions of the foregoing etching apparatus are as follows: Prior to the initiation of an etching operation, the circulation tank 32 is filled with the etchant 34 to a height at which the level sensor 36 detects the liquid level of the etchant 34. The etchant 34 contains a predetermined proportion of nitric acid and a predetermined proportion of hydrofluoric acid. The content of the nitric acid may be about 20 to 60% by weight, while the content of hydrofluoric acid may be about 5 to 15% by weight. Where necessary, the pump 43 is actuated, with the on-off valve 44 disposed on the channel 40 being closed, and the on-off valve 48 disposed on the branch path 46 being opened. As a result, the etchant 34 in the circulation tank 32 is circulated through the temperature adjustment means 50, whereby the etchant 34 is brought to a required temperature which may be, for example, 20° C. The etching step of etching the back side, i.e., upper surface, of the silicon wafer 10 carried onto the support means 2 is performed by actuating the pump 43, with the on-off valve 48 disposed on the branch path 46 being closed, and the on-off valve 44 disposed on the channel 40 being opened, thereby spraying the etchant 34 toward the upper surface of the silicon wafer 10 through the spray nozzle 42. As is well known among people skilled in the art, when the etchant 34 containing nitric acid and hydrofluoric acid is sprayed over the upper surface of the silicon wafer 10, an oxidation reaction expressed by

$$Si+2HNO_3 \rightarrow SiO_2+NO_2+NO+H_2O$$

takes place as a first stage, and a dissolution reaction expressed by

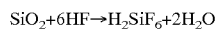
$$SiO_2+6HF \rightarrow H_2SiF_6+2H_2O$$

occurs as a second stage. Thus, etching of the silicon wafer 10 can be expressed by

$$Si+2HNO_3+6HF \rightarrow H_2SiF_6+3H_2O+NO_2+NO$$

Under a situation under which a sufficient amount of nitric acid is present, the etching speed is determined by the concentration of hydrofluoric acid and the temperature of the etchant 34. To set a required etching speed, therefore, it is important to set the temperature of the etchant 34 at a predetermined value, and set the content of hydrofluoric acid at a predetermined value, as well as set an excessive content of nitric acid in the etchant 34. To etch the upper surface of one silicon wafer 10 placed on the support means 2 into a required state, the etchant in a predetermined amount, which may be, for example, about 2.0 liters, is sprayed through the spray nozzle 42.

In applying the etchant 34 to the upper surface of the silicon wafer 10 on the support means 2 to etch the silicon wafer 10, the support means 2 is rotated at a speed which may be about 600 rpm. By this measure, the etchant 34 sprayed is spread sufficiently uniformly throughout the upper surface of the silicon wafer 10. The air blow means 12 provided on the support means 2 flows air from around the peripheral edge of the support means 2 along the lower surface of the silicon wafer 10, thereby preventing the etchant 34 from contacting the lower surface, i.e., the face side, of the silicon wafer 10. The moving member 22 of the recovery means 16 is located at the ascending position indicated by the solid lines in FIG. 2, so that the etchant 34 flowed on the upper surface of the silicon wafer 10 is recovered into the recovery means 16.

Simultaneously with the start of the above-described etching step, or during the etching step, or after completion of the etching step, a recovery/regeneration step for the etchant 34 is performed. In the recovery/regeneration step, the pump 78 is actuated, with the on-off valve 88 disposed on the channel 84 being closed, the on-off valve 90 disposed on the drain path 86 being closed, and the on-off valve 82 disposed on the channel 80 being opened. Thus, the etchant 34 recovered into the recovery means 16 is fed to the etchant introduction means 66 of the gas-liquid contact tower 62 through the channel 76, and flowed downward through the main section 64. In the gas-liquid contact tower 62, the gas supplied from the gas supply source 72 is flowed into a site below the main section 64, and flowed upward through the main section 64. Hence, the descending etchant 34 and the ascending gas are brought into effective contact in the main section 64 packed with the many packing elements. As stated earlier, etching of the upper surface of the silicon wafer 10 results in the formation of $NO_x$ ($NO_2$ and NO). Upon contact of the etchant 34 with the gas, however, $NO_x$ accompanies the gas, and is removed from the etchant 34. The gas ascending through the main section 64, while accompanied by $NO_x$, is discharged from the gas-liquid contact tower 62 through the gas discharge means 68, and released after a required treatment. The gas contacted with the etchant 34 is, importantly, inert to the etchant 34. Air can be cited as a preferred gas. If desired, nitrogen or an inert gas such as argon or helium can be used. The etchant 34 flowing downward through the main section 64 of the gas-solution contact tower 62 is collected into the collection tank 74, and returned to the etchant introduction means 66 through the channel 80. To remove $NO_x$ sufficiently from the recovered etchant 34, it is preferred that the etchant 34 recovered into the recovery means 16 is flowed downward through the main section 64 of the gas-liquid contact tower 62 repeatedly, a plurality of times.

Upon completion of the recovery/regeneration step for the etchant 34, the on-off valve 82 disposed on the channel 80 is closed. The on-off valve 90 disposed on the drain path 86 is opened for a predetermined period of time, whereby a predetermined amount of the recovered and regenerated etchant 34 is discarded after a required treatment. Upon etching of the silicon wafer 10, hexafluorosilicic acid ($H_2SiF_6$) is formed as stated previously. Accordingly, repeated etching results in a gradual increase in the amount of hexafluorosilicic acid in the etchant 34. However, if a predetermined amount of the etchant 34 recovered and regenerated for each etching step is discarded, the amount of hexafluorosilicic acid generated by one etching step, and the amount of hexafluorosilicic acid contained in the discarded etchant 34 become equal after a predetermined number of the etching steps are performed. Thereafter, hexafluorosilicic acid in the etchant 34 continues to be maintained in a constant amount. According the experience of the inventors, if the amount of hexafluorosilicic acid in the etchant 34 is about 10% by weight or less, the presence of hexafluorosilicic acid is substantially unlikely to affect the etching step adversely. In the illustrated embodiment, a part of the recovered and regenerated etchant 34 is discarded. If desired, however, a part of the recovered etchant 34 can be discarded before regeneration.

Simultaneously with or after the start of discarding the etchant 34 by opening the on-off valve 90 on the drain path 86, the on-off valve 88 on the channel 84 is opened to return the remainder of the recovered and regenerated etchant 34, i.e., all of this etchant 34 excluding the discarded part, to the circulation tank 32 for recycling. Since part of the recovered and regenerated etchant 34 is discarded, and some of the etchant 34 is lost during the etching step, the liquid level of the etchant 34 in the circulation tank 32 is lower than the level detected by the level sensor 36, even after the regenerated etchant 34 is returned to the circulation tank 32. Thus, the on-off valve 58 on the channel 54 is opened to feed the replenishing solution 56 from the replenishment means 52 to the circulation tank 32 for replenishment until the level sensor 36 detects the liquid level of the etchant 34 in the circulation tank 32. The amount of the etchant 34 lost during etching of one silicon wafer 10 is substantially constant. Thus, the amount of the replenishing solution 56 fed to the circulation tank 32 for replenishment at the time of each etching of one silicon wafer 10 is also substantially constant. The contents of nitric acid and hydrofluoric acid in the replenishing solution 56 are preferably set such that the amounts of nitric acid and hydrofluoric acid consumed by etching, and the amounts of nitric acid and hydrofluoric acid lost by discarding part of the etchant 34 will be compensated for by feeding a predetermined amount of the replenishing solution 56 for replenishment, and accordingly, the contents of nitric acid and hydrofluoric acid in the etchant 34 in the circulation tank 32 will be kept substantially constant. Then, the pump 43 is actuated, with the on-off valve 44 disposed on the channel 40 being closed, and the on-off valve 48 disposed on the branch path 46 being opened, whereby the etchant 34 in the circulation tank 32 is circulated through the temperature adjustment means 50. As a result, the etchant 34 is brought to a required temperature which may be, for example, 20° C., to be ready for a next etching step. As is well known, when an etching step is performed, the temperature of the etchant 34 is raised. To bring the etchant 34 to the required temperature, therefore, it is necessary to cool the etchant 34 by the temperature adjustment means 50.

Upon completion of the etching step of applying the etchant 34 onto the upper surface of the silicon wafer 10 borne on the support means 2 to etch the silicon wafer 10, the silicon wafer 10 on the support means 2 can be rinsed and dried, as required. The rinsing step can be performed advantageously by retreating the spray nozzle 42 for the etchant 34 from the operating position above the silicon wafer 10 to the non-operating position, positioning a spray nozzle (not shown), which sprays a cleaning liquid, optionally, pure water, above the silicon wafer 10, and spraying the cleaning liquid from the spray nozzle over the upper surface of the silicon wafer 10. on this occasion, the moving member 22 of the recovery means 16 is lowered to the descending position indicated by the two-dot chain lines in FIG. 2 to close the annular inlet 30 of the recovery tank 18, thereby preventing the cleaning liquid from entering the recovery means 16. Drying of the silicon wafer 10 can be performed by so-called spin drying which rotates the support means 2 at a high speed of, for example, about 2,000 to 3,000 rpm.

The preferred embodiments of the present invention have been described in detail with reference to the accompanying drawings. However, it should be understood that the invention is not limited to such embodiments, and various changes and modifications may be made without departing from the spirit and scope of the invention.

EXAMPLE

A ground back side of a silicon wafer with a nominal diameter of 8 inches was etched with the use of the etching apparatus as explained with reference to FIGS. 1 and 2. Prior to the start of etching, 20 liters of an etchant was accommodated in the circulation tank. The etchant was an aqueous solution containing 59% by weight of nitric acid and 7% by weight of hydrofluoric acid. The level sensor provided on the circulation tank was set so as to detect the liquid level of the etchant when the etchant in the circulation tank amounted to 20 liters. The etchant in the circulation tank was circulated through the branch path on which the temperature adjustment means was disposed, to make the temperature of the etchant about 20° C. Then, with the support means rotated at a speed of 600 rpm, the etchant was sprayed from the spray nozzle toward a central area of the upper surface of the silicon wafer on the support means to etch the upper surface, i.e., the back side, of the silicon wafer. The amount of the etchant sprayed per unit time was 3.0 liters/min, the spray time was 40 seconds, and the amount of spray was 2.0 liters. The entire back side of the silicon wafer was etched sufficiently uniformly over the thickness of 20 $\mu$m. The temperature of the etchant recovered into the recovery means was about 70° C.

Simultaneously with the start of spraying of the etchant from the spray nozzle, the pump disposed on the channel between the recovery means and the regeneration means was actuated for regeneration of the recovered etchant. As a result, the etchant recovered into the recovery means was fed to the etchant introduction means of the gas-liquid contact tower, and flowed downward through the main section of the gas-liquid contact tower. The etchant collected into the collection tank was repeatedly fed to the etchant introduction means, and flowed downward through the main section of the gas-solution contact tower. The main section of the gas-solution contact tower was defined by a cylindrical member of a semitransparent vinyl chloride resin, and had an internal diameter of 110 mm and a height of 500 mm.

This main section was packed with polypropylene packing elements to a height of 400 mm from the lower surface of the main section. The polypropylene packing elements are commercially available under the trade name "Teralet" (Nittetsu Kakoki Kabushiki Kaisha). During regeneration of the etchant, air was supplied at a rate of 200 liters/min to the air introduction means of the gas-solution contact tower. The regeneration means was run for 110 seconds (accordingly, the recovery/regeneration step was initiated simultaneously with the start of the etching step, and was terminated 70 seconds after completion of the etching step). The etchant fed from the recovery means to the gas-liquid contact tower was initially turbid in a light brown color, but at completion of the recovery/regeneration step, was rendered transparent like the color before use in the etching step.

After completion of the recovery/regeneration step, 60 cc of the etchant was discarded through the drain path, and the remaining etchant was returned to the circulation tank. Then, the replenishing solution was fed from the replenishment means to the circulation tank for replenishment until the level sensor detected the liquid level of the etchant. The amount of the replenishing solution fed from the replenishment means to the circulation tank for replenishment was 78 cc. This means that 18 cc of the etchant was lost during the etching step. The replenishing solution was an aqueous solution containing 50% by weight of nitric acid and 14% by weight of hydrofluoric acid, and the concentration of hydrofluoric acid in the etchant in the circulation tank after feeding of the replenishing solution for replenishment was restored to 7% by weight. Then, after the temperature of the etchant was adjusted to 20° C., a next etching step was performed. In this manner, the back side of each of 500 silicon wafers was etched. The nitric acid concentration in the etchant was initially decreased gradually by repeated etching, but after being decreased to 45% by weight, it was maintained at 45% by weight, without a further decrease. A nitric acid concentration of 45% by weight is, so to speak, an excess over a hydrofluoric acid concentration of 7% by weight. Inspection of the back side of the silicon wafer after etching showed that the etched back side was the desired mirror surface in all of the 500 silicon wafers.

What we claim is:

1. An etching method comprising an etching step of applying an etchant containing nitric acid and hydrofluoric acid to silicon to etch the silicon, including:
    a recovery/regeneration step of recovering the etchant used in the etching step, and bringing a gas inert to the etchant into contact with the recovered etchant to regenerate the etchant,
    at least a part of the regenerated etchant after recovery and regeneration in the recovery/regeneration step being reused in the etching step.

2. The etching method of claim 1, wherein:
    the gas contacted with the etchant recovered in the recovery/regeneration step is air.

3. The etching method of claim 1, wherein:
    in the etching step, a predetermined amount of the etchant is delivered out of the etchant accommodated in a circulation tank, and is applied to silicon;
    the regenerated etchant for reuse in the etching step is returned to the circulation tank; and
    a replenishing solution containing nitric acid and hydrofluoric acid is fed into the circulation tank for bringing at least a proportion of hydrofluoric acid in the etchant in the circulation tank to a predetermined value before the etchant is delivered from the circulation tank for a next etching step.

4. The etching method of claim 1, wherein:
    a predetermined proportion of the etchant regenerated in the recovery/regeneration step is discarded; and
    a remainder is reused in the etching step.

5. The etching method of claim 4, wherein:
    the discarded proportion of the etchant regenerated in the recovery/regeneration step is set such that an equilibrium is achieved between an amount of hexafluorosilicic acid formed in the etching step and an amount of hexafluorosilicic acid contained in the regenerated etchant discarded.

6. The etching method of claim 1, wherein:
    a temperature of the etchant applied to the silicon in the etching step is adjusted to a predetermined temperature.

7. An etching apparatus for applying an etchant containing nitric acid and hydrofluoric acid to silicon to etch the silicon, comprising:
    support means for supporting the silicon to be etched;
    transport means for carrying the silicon to be etched onto the support means, and carrying the etched silicon out of the support means;
    a circulation tank accommodating the etchant containing nitric acid and hydrofluoric acid;
    etchant applicator means for applying the etchant accommodated in the circulation tank to the silicon supported by the support means;
    recovery means for recovering the etchant applied to the silicon supported by the support means;
    regeneration means for bringing a gas inert to the etchant into contact with the etchant recovered by the recovery means to regenerate the etchant; and
    circulation means for returning at least a part of the etchant regenerated by the regeneration means to the circulation tank.

8. The etching apparatus of claim 7, wherein:
    the regeneration means brings air into contact with the recovered etchant.

9. The etching apparatus of claim 7, wherein:
    the regeneration means is composed of a gas-liquid contact tower including:
    a main section packed with many packing elements;
    etchant introduction means for introducing the etchant to be regenerated, from above the main section into the main section;
    gas introduction means for introducing a gas from below the main section into the main section; and
    gas discharge means for discharging the gas from above the main section.

10. The etching apparatus of claim 9, wherein:
    the gas-liquid contact tower includes a collection tank for collecting the etchant that has flowed downward through the main section; and
    the etchant introduction means introduces the etchant recovered by the recovery means into the main section, and also repeatedly introduces the etchant collected into the collection tank into the main section.

11. The etching apparatus of claim 7, wherein:
    the etchant applicator means delivers a predetermined amount of the etchant from the circulation tank, and applies it to the silicon supported by the support means; and
    replenishment means is disposed for feeding a replenishing solution containing nitric acid and hydrofluoric acid into the circulation tank for bringing at least a proportion of hydrofluoric acid in the etchant in the circulation tank to a predetermined value before the etchant applicator means delivers the etchant from the circulation tank for a next etching step.

12. The etching apparatus of claim 7, further comprising:
discard means for discarding a predetermined proportion of the etchant regenerated by the regeneration means.

13. The etching apparatus of claim 7, further comprising:
temperature adjustment means for adjusting the etchant in the circulation tank to a predetermined temperature.

* * * * *